US010454495B2

(12) United States Patent
Motwani et al.

(10) Patent No.: US 10,454,495 B2
(45) Date of Patent: Oct. 22, 2019

(54) APPARATUS AND METHOD FOR MAPPING BINARY TO TERNARY AND ITS REVERSE

(71) Applicant: Intel Corporation, Santa Clara, CA (US)

(72) Inventors: Ravi H. Motwani, San Diego, CA (US); Pranav Kalavade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 171 days.

(21) Appl. No.: 14/490,307

(22) Filed: Sep. 18, 2014

(65) Prior Publication Data

US 2016/0087646 A1    Mar. 24, 2016

(51) Int. Cl.
  *G06F 9/38*    (2018.01)
  *H03M 7/02*    (2006.01)
  *H03M 5/16*    (2006.01)
  *G06F 3/00*    (2006.01)

(52) U.S. Cl.
  CPC ............... *H03M 7/02* (2013.01); *H03M 5/16* (2013.01)

(58) Field of Classification Search
  None
  See application file for complete search history.

(56) References Cited

U.S. PATENT DOCUMENTS

| 5,633,631 | A | * | 5/1997 | Teckman | ................ H03M 5/16 341/57 |
| 5,841,874 | A | | 11/1998 | Kempke et al. | |
| 7,071,850 | B1 | | 7/2006 | Fitzgibbon | |
| 7,219,319 | B2 | | 5/2007 | Gould et al. | |
| 8,694,854 | B1 | | 4/2014 | Dar et al. | |
| 2007/0204128 | A1 | | 8/2007 | Lee et al. | |
| 2013/0166994 | A1 | | 6/2013 | Mittelholzer et al. | |
| 2014/0063939 | A1 | | 3/2014 | Marcu et al. | |
| 2014/0115231 | A1 | | 4/2014 | Motwani et al. | |
| 2015/0100712 | A1 | * | 4/2015 | Sengoku | ................ G06F 13/28 710/110 |

FOREIGN PATENT DOCUMENTS

| CN | 101938433 | 1/2011 |
| WO | 9807160 | 2/1998 |
| WO | 9807160 A2 | 2/1998 |
| WO | 2013093669 | 6/2013 |

OTHER PUBLICATIONS

International Search Report and Written Opinion for International Patent Application No. PCT/US2015/043660, dated Dec. 23, 2015, 22 pages.

(Continued)

*Primary Examiner* — Scott C Sun
(74) *Attorney, Agent, or Firm* — Green, Howard & Mughal LLP

(57) ABSTRACT

Described is an apparatus for converting binary data to ternary and back such that the apparatus comprises: a first look-up table (LUT) having a mapping of 19 binary bits to 12 ternary trits; and a first logic to receive a binary input and to convert the binary input to a ternary output according to the first LUT.

23 Claims, 5 Drawing Sheets

(56) References Cited

OTHER PUBLICATIONS

Office Action and Search Report, dated Jul. 29, 2016, for TW Patent Application No. 104125642, 9 pages.
Seong "Tri-Level-Cell Phase Change Memory: Toward an Efficient and Reliable Memory System", In Proceedings of the 40th Annual International Symposium on Computer Architecture (ISCA '13), 2013, pp. 445, table 7, 12 pages.
International Preliminary Report on Patentability for PCT/US15/43660 dated Mar. 30, 2017, 11 pages.
Supplemental European Search Report dated Apr. 6, 2018 for EP Patent Application No. EP15872777.
Anonymous. Binary (base 2) to Ternary (base 3) Table TrustConverter, Mar. 20, 2018 (Mar. 20, 2018), XP055461697, Retrieved from the Internet: URL:https://trustconverter.com/en/base-number-conversion/binary/binary-to-ternary/ba se-number-conversion-table.html.
Non-Final Office Action from Chinese Patent Application No. 201580044084.1 notified Apr. 12, 2019, 6 pgs.

* cited by examiner

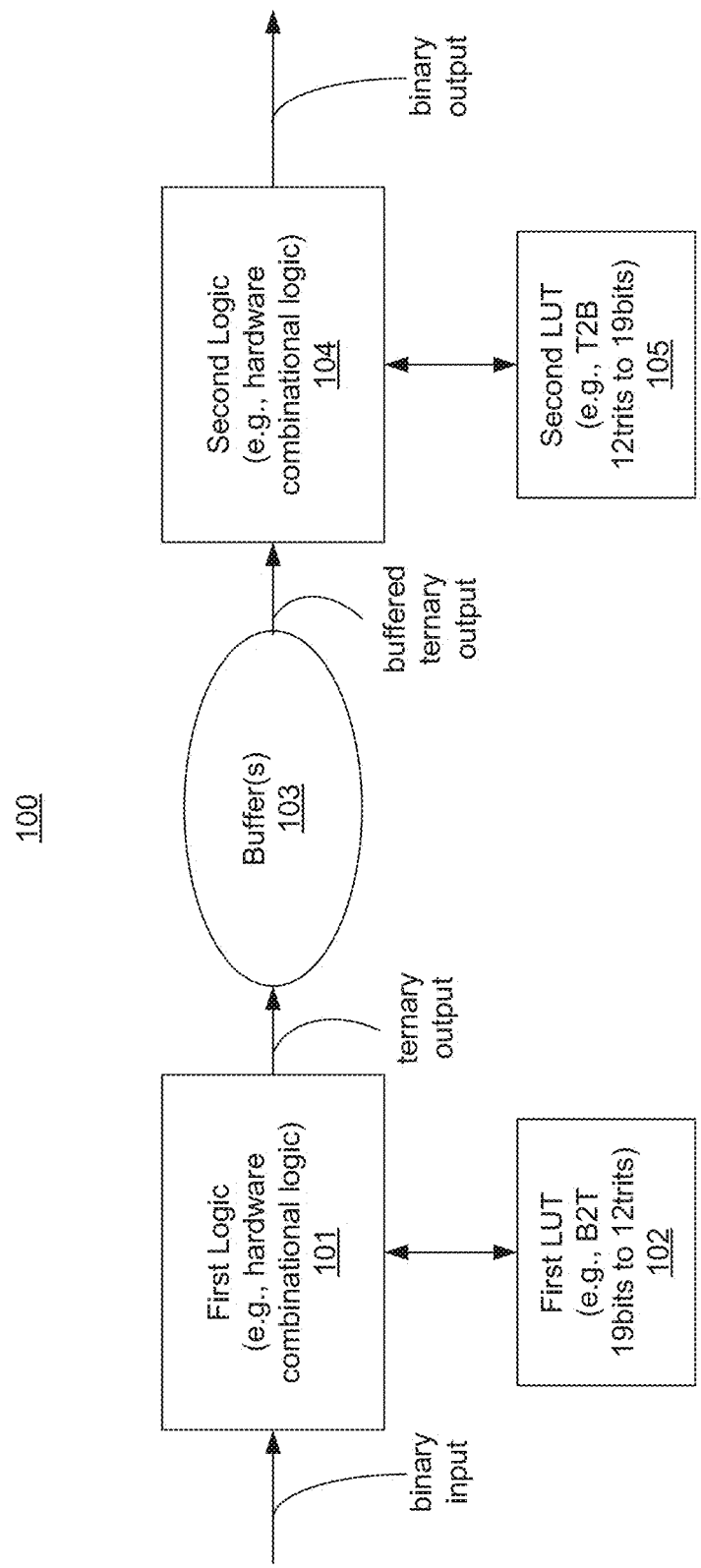

| 300 (e.g., 105) | |
|---|---|
| Ternary Value | Binary Representation |
| $3^0=1$ | 1 |
| $3^1=3$ | 11 |
| $3^2=9$ | 1001 |
| $3^3=27$ | 11011 |
| $3^4=81$ | 1010001 |
| $3^5=243$ | 11110011 |
| ... | ... |
| $3^{11}=177,174$ | 10101101010000010110 |

Fig. 3

| 200 (e.g., 102) | |
|---|---|
| Binary Value | Ternary Representation |
| $2^0=1$ | 1 |
| $2^1=2$ | 2 |
| $2^2=4$ | 11 |
| $2^3=8$ | 22 |
| $2^4=16$ | 121 |
| $2^5=32$ | 1012 |
| ... | ... |
| $2^{18}=262,144$ | 111022121001 |

Fig. 2

APPARATUS AND METHOD FOR MAPPING BINARY TO TERNARY AND ITS REVERSE

BACKGROUND

Flash memory may be designed using single-level cells, which store a single bit of information in each memory cell, or as multi-level cells, which store multiple bits of information in each memory cell. In general, single-level cells have higher endurance than multi-level cells. However, multi-level cells provide higher storage density than single-level cells. A multi-level cell memory (e.g., a flash memory) is comprised of multi-level cells, each of which is able to store multiple charge states or levels. Each of the charge states is associated with a memory element bit pattern. A multi-level cell memory is configurable to store multiple threshold voltage levels ($V_t$).

A multi-level cell memory is able to store more than one bit of data based upon the number of charge states. For example, a multi-level cell memory that can store four charge states (or four Vt levels) can store two bits of data, a multilevel cell memory that can store eight charge states (or eight Vt levels) can store three bits of data, and a multilevel cell that can store sixteen charge states can store four bits of data. For each of the n-bit multi-level cell memories, various memory element bit patterns can be associated with each of the different charge states. A reference voltage may separate the various charge states. For example, a first voltage reference may separate level 3 and level 2, a second voltage reference may separate level 2 from level 1, and a third reference voltage may separate level 1 from level 0.

Binary information may be mapped directly to a single-level cell memory. However, multi-level cells require memory mapping operations to map binary information onto the number of levels in the multi-level cells. A binary to ternary mapping is a function which takes binary data and maps it to ternary symbols. A typical binary to ternary mapping first obtains a decimal representation of the binary string and then maps this decimal number to its ternary representation. The compression obtained by this mapping is close to the theoretical limit. For example, 1 kilobyte bits (i.e., 8192 bits) can be mapped to 5169 ternary symbols. The compression obtained is 1.5848 which is close to the theoretical limit. The theoretical storage limit of each 3-level memory cell is Log 2(3)=1.5849 bits One problem with this typical binary to ternary mapping is that it suffers from error propagation. Consider a binary string "000 . . . 001111" to be stored. The decimal representation of this string is 15 and the ternary representation is "000 . . . 00120". This ternary string stored (e.g., to a NAND flash memory) as level information in the cells is read back. Since there are errors when reading from the memory (e.g., NAND flash memory), say "0000 . . . 00121" is read back (i.e., the last level 0 is readout as level 1). The binary representation for this noisy readout is "000 . . . 0010000". Hence, an error of a single level translates to 5 bits in read out error. The typical mapping has an error propagation by a factor of 3.5, which means that the bit error rate is 3.5 times the level error rate.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1 illustrates a hardware architecture that uses look-up tables (LUTs) for mapping binary to ternary and back, according to some embodiments of the disclosure.

FIG. 2 illustrates a LUT with 19 bits binary input and 12 trits ternary symbol output with ternary representation of powers of 2, according to some embodiments of the disclosure.

FIG. 3 illustrates a LUT with 12 trits ternary symbol input and 19 bits binary output with binary representation of powers of 3, according to some embodiments of the disclosure.

DETAILED DESCRIPTION

Figure 4:
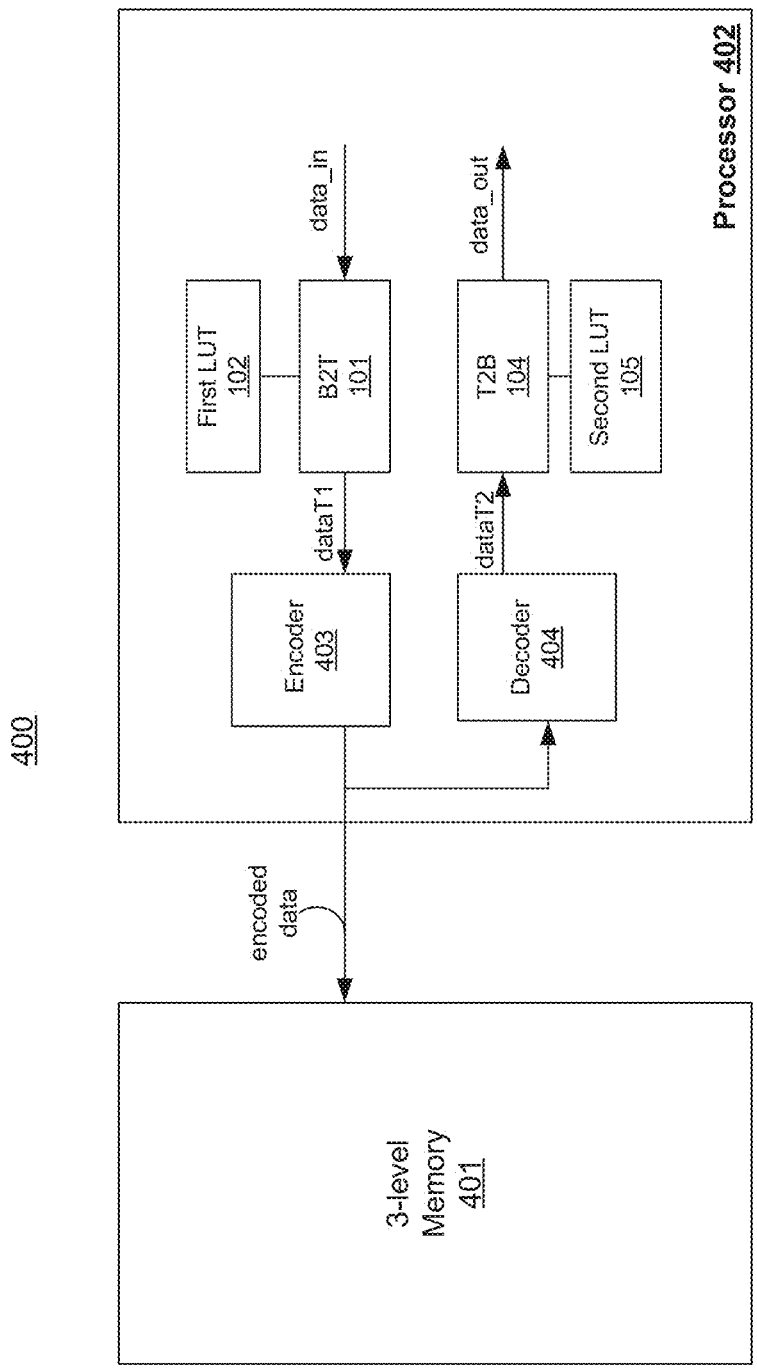
FIG. 4 illustrates a memory architecture to store data to a multi-level (e.g., 3-level) memory cell according to the hardware architecture of FIG. 1, according to some embodiments of the disclosure.

For flash memories (e.g., NAND memories) used in multi-level storage mode (e.g., three threshold voltage level mode), there are various ways in which the binary bits can be mapped to the three threshold levels. For example, the payload can be Error Protection Code (ECC) protected first and then the binary ECC bits can be mapped from the binary to the ternary domain. Another scheme is to first do a binary to ternary mapping of the payload and then have a ternary ECC code operate on the ternary data. There are distinct advantages in using the ternary ECC scheme. The binary ECC scheme may require the levels read from the memory to be first converted from the ternary to the binary domain. Since there are errors in the ternary levels read, there is error propagation by a factor of two when the ternary symbols are converted to binary bits.

However, if ternary ECC schemes are used, then the ternary ECC first corrects all the errors. The ternary to binary mapping, which operates on noise-free data, provides the binary bits with no errors. The typical binary to ternary mapping is very complex to implement. For example, the ECC codeword size for a sample data is approximately 4.6 kilobyte bits or approximately 37,665 bits. If these 37,665 bits are to be converted to their corresponding ternary representation, the gate count is 4*37665=150,000 gates. A similar number of gates are required for the ternary to binary mapping which maps ternary data to binary data during reads using the typical binary to ternary mapping. Various embodiments describe an optimal binary to ternary map and detail its hardware implementation.

The mapping described in some embodiments is a 19-12 mapping which takes 19 binary bits and maps them to 12 ternary symbols (or trits) using a look-up table (LUT). The theoretical storage limit of each 3-level memory cell is Log 2(3)=1.5849 bits. In some embodiments, the conversion gets 1.5833 bits mapped to one ternary symbol, which is closer to the theoretical limit of 1.5849 bits per cell (bpc). In some embodiments, the hardware implementation of this mapping uses logic gates in the range of 100 gates, which is much less complex than the hardware for the typical binary to ternary mapping.

While the embodiments are described with reference to storing in a 3-level memory (e.g., 3-level NAND, 3-level Phase Change Memory, etc.), the embodiments are not limited to such. In some embodiments, for a 6-level programming, the 19-12 mapping can be generalized as follows. For example, the levels for a 6-level programming are divided into two groups—first group of L0, L1, and L2 and second group of L3, L4, and L5, where 'L' refers to level. In some embodiments, one bit is used to decide the group (i.e., first group or second group), and then the 19-12 map is used to store 1.583 bpc within the three levels of a group. With such embodiments, storing of 2.583 bpc is achieved. The scheme described in various embodiments can be extended to any multiple of two or three levels of programming. For example, 9-level programming, 12-level programming, 18-level programming, 27-level programming, etc.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The terms "substantially," "close," "approximately," "near," and "about," generally refer to being within +/−20% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

FIG. 1 illustrates a hardware architecture 100 that uses LUTs for mapping binary to ternary and back, according to some embodiments of the disclosure. In some embodiments, architecture 100 comprises a First Logic 101, First LUT 102, Buffer(s) 103, Second Logic 104, and Second LUT 105. In some embodiments, First Logic 101 comprises combination logic and/or finite state machine (FSM) that accesses First LUT 102 to convert a binary input to a ternary symbol output.

In some embodiments, First Logic 101 includes logic to initialize the ternary output value to zero. In some embodiments, First Logic 101 then checks for the location of ones in the 19-bit tuple (i.e., the binary input). In some embodiments, where ever a one is detected in the binary input, its ternary representation is read from First LUT 102 and added to the ternary value (which was first initialized to zero). First LUT 102 is described with reference to FIG. 2, according to some embodiments. Referring back to FIG. 1, in some embodiments, the addition takes place in the ternary domain. In some embodiments, when all the ones in the 19-bit tuple are considered, a 12-ternary symbol value is obtained and provided as ternary output.

In some embodiments, Second Logic 104 includes logic to initialize the binary output to zero. In some embodiments, Second Logic 104 then checks for the location of ones in the 12-trit symbol (i.e., the buffered ternary output). In some embodiments, where ever a one is detected in the buffered ternary output, its binary representation is read from Second LUT 105 and added to the binary value (which was at first initialized to zero). Second LUT 105 is described with reference to FIG. 3, according to some embodiments. Referring back to FIG. 1, in some embodiments, the addition takes place in the binary domain. In some embodiments, when all the ones in the 12-trit symbol are considered, a 19-bit binary value is obtained and provided as binary output. The hardware implementation of Second Logic 104 may be similar as the hardware implementation of First Logic 101.

Using these mappings, some embodiments can efficiently convert the binary data into a ternary domain at an encoder during write operation and the ternary data to binary form at a decoder during read operation. In some embodiments, the 19-12 mapping provides the most efficient mapping to the theoretical limit of 1.585 bpc.

FIG. 2 illustrates a LUT 200 (e.g., First LUT 102) with 19-bit binary input and 12 trit ternary symbol output with ternary representation of powers of 2, according to some embodiments of the disclosure. It is pointed out that those elements of FIG. 2 having the same reference numbers (or names) as the elements of any other figure can operate or function in any manner similar to that described, but are not limited to such. In some embodiments, LUT 200 has 19 entries corresponding to the power of two in ternary for all powers of two from 0 to 18.

In some embodiments, LUT 200 is implemented in a non-volatile memory. Examples of non-volatile memories are phase change memory (PCM), a three dimensional cross point memory, a resistive memory, nanowire memory, ferro-electric transistor random access memory (FeTRAM), flash memory such as NAND or NOR, magnetoresistive random access memory (MRAM) memory that incorporates memristor technology, spin transfer torque (STT)-MRAM, etc. In other embodiments, LUT 200 is implemented in other types of storing circuits.

FIG. 3 illustrates a LUT 300 (e.g., Second LUT 105) with 12 trit ternary symbol input and 19 bit binary output with binary representation of powers of 3, according to some embodiments of the disclosure. It is pointed out that those elements of FIG. 3 having the same reference numbers (or names) as the elements of any other figure can operate or function in any manner similar to that described, but are not limited to such. In some embodiments, LUT 300 has 12 entries corresponding to the power of three from 0 to 11. In some embodiments, LUT 300 is implemented in a non-volatile memory. In other embodiments, LUT 300 is implemented in other types of storing circuits.

FIG. 4 illustrates memory architecture 400 to store data in a multi-level memory (e.g., 3-level memory) according to the hardware architecture of FIG. 1, according to some embodiments of the disclosure. It is pointed out that those elements of FIG. 4 having the same reference numbers (or names) as the elements of any other figure can operate or function in any manner similar to that described, but are not limited to such.

Memory architecture 400 may be a Solid State Drive (SSD), according to some embodiments. In other embodiments, other types of architectures may be used. So as not to obscure the embodiments, a simplified version of memory architecture 400 is shown. A person skilled in the art would appreciate that there are other logic and circuits needed for complete operation of architecture 400. For example, input-output (I/O) buffers (such as Serial Advanced Technology Attachment (SATA) interface) and corresponding circuits are not shown.

In some embodiments, memory architecture 400 comprises a 3-level memory 401 (e.g., a 3-level NAND flash memory, a 3-level Phase Change Memory (PCM), etc.) and Processor 402 (e.g., memory controller). While memory 401 is shown as a single unit, it may include a plurality of non-volatile memory sub-units each of which having 3-level memory cells. In some embodiments, memory 401 may be integrated within Processor 402 on the same package. In some embodiments, Memory 401 may be separate on a distinct die but on the same package or on different packages.

For some memories (e.g., L06 NAND), the non-volatile memory cell (e.g., 3-level NAND cell) are programmed to 3 levels (i.e., bits are mapped to the 3 levels). Some embodiments describe a 1.5 bits/cell programming scheme. This includes programming three bits to two non-volatile memory cells. Two non-volatile memory cells can jointly represent nine combinations. One of the combinations is left un-programmed while the other eight combinations are uniquely mapped to 3 bits. Hence 1.5 bits are stored per non-volatile memory cell. The theoretical storage limit of each non-volatile memory cell is actually 1.5849 bits. Hence storing 1.5 bits/cell is inefficient. Architecture 100 and SSD 400 describe hardware and associated method to substantially reach the storage limit of 1.5849 bits/cell, according to some embodiments of the disclosure.

In some embodiments, Processor 402 comprises Encoder 403, Decoder 404, First Logic 101 (i.e., Binary to Ternary (B2T) Converter), First LUT 102, Second Logic 104 (i.e., Ternary to Binary (T2B) Converter), and Second LUT 105. In some embodiments, input binary data (data_in) is received by B2T Converter 101 which converts data_in to ternary dataT1 using mapping of First LUT 102 as described with reference to FIG. 1. Referring back to FIG. 4, in some embodiments, ternary dataT1 is encoded by Encoder 403 that generates encoded data (i.e., encoded level information) for storing in Memory 401.

When data is requested by Processor 402, encoded data is retrieved from Memory 401 and decoded by Decoder 404. The output dataT2 of Decoder 404 is ternary data because the encoded data was ternary data. In some embodiments, dataT2 is received by T2B Converter 105 which converts dataT2 to binary output data_out using mapping of Second LUT 105 as described with reference to FIG. 1. Here, error-free level information output data_out by Decoder 404 is mapped to the binary domain by T2B Converter 105.

Referring back to FIG. 4, in some embodiments, Encoder 403 is a Low Density Parity Check (LDPC) encoder and Decoder 404 is an LDPC Decoder. In other embodiments, other types of encoding and corresponding decoding schemes may be used. For example, the Bose, Chaudhuri, and Hocquenghem (BCH) encoding and corresponding decoding scheme may be used. In some embodiments, non-Binary LDPC codes provide better performance than binary LDPC codes at the cost of extra hardware. In the case of ternary codes, the extra hardware cost is minimal, according to some embodiments. The Residual Bit-Error Rate (RBER) gains of some embodiments are significant compared to the binary codes. For example, the RBER gains due to the compact binary to ternary mapping described with reference to various embodiments and the ternary LDPC codes are approx. 1.53 times, allowing a RBER of $2.3e^{-2}$.

Figure 5:
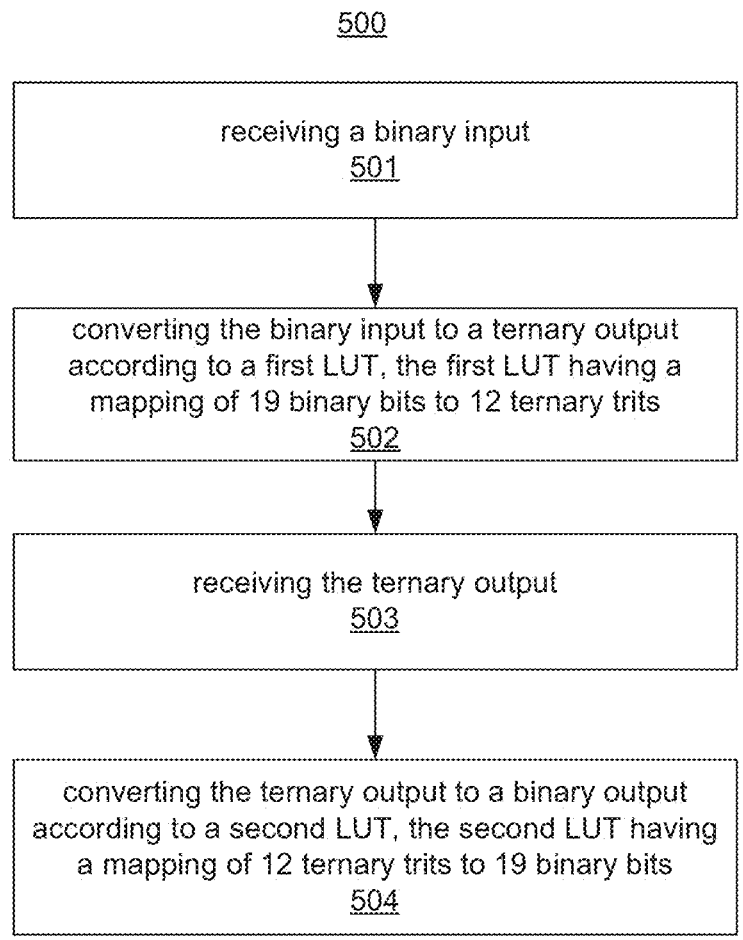
FIG. 5 illustrates a flowchart of a method for mapping binary to ternary and back, according to some embodiments of the disclosure.

FIG. 5 illustrates a flowchart 500 of a method for mapping binary to ternary and back, according to some embodiments of the disclosure. It is pointed out that those elements of FIG. 5 having the same reference numbers (or names) as the elements of any other figure can operate or function in any manner similar to that described, but are not limited to such.

Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 501, binary input is received by First Logic 101. At block 502, the binary input is converted to a ternary output by First Logic 101 according to First LUT 102, where First LUT 102 includes mapping of 19 binary bits to 12 ternary trits as shown with reference to FIG. 2. In some embodiments, First Logic 101 initializes the ternary output value to zero. In some embodiments, First Logic 101 then checks for the location of ones in the 19-bit binary input. In some embodiments, where ever a one is detected in the binary input, its ternary representation is read from First LUT 102 and added to the ternary value (which was first initialized to zero). In some embodiments, when all the ones in the 19-bit binary input are considered, a 12-ternary symbol value is obtained and provided as ternary output for storing in memory (e.g., Memory 401).

Referring back to FIG. 5, at block 503, ternary output is retrieved from memory (e.g., Memory 401) and provided to Second Logic 104. At block 504, Second Logic 104 converts the ternary output to a binary output according to Second LUT 105, where Second LUT 105 includes a mapping of 12 ternary trits to 19 binary bits as described with reference to FIG. 3.

In some embodiments, Second Logic 104 includes logic to initialize the binary output to zero. In some embodiments, Second Logic 104 then checks for the location of ones in the 12-trit symbol (i.e., the ternary output retrieved from Memory 401). In some embodiments, where ever a one is detected in the ternary output, its binary representation is read from Second LUT 105 and added to the binary value (which was at first initialized to zero). In some embodiments, the addition takes place in the binary domain. In some embodiments, when all the ones in the 12-trit symbol are considered, a 19-bit binary value is obtained and provided as binary output.

Figure 6:
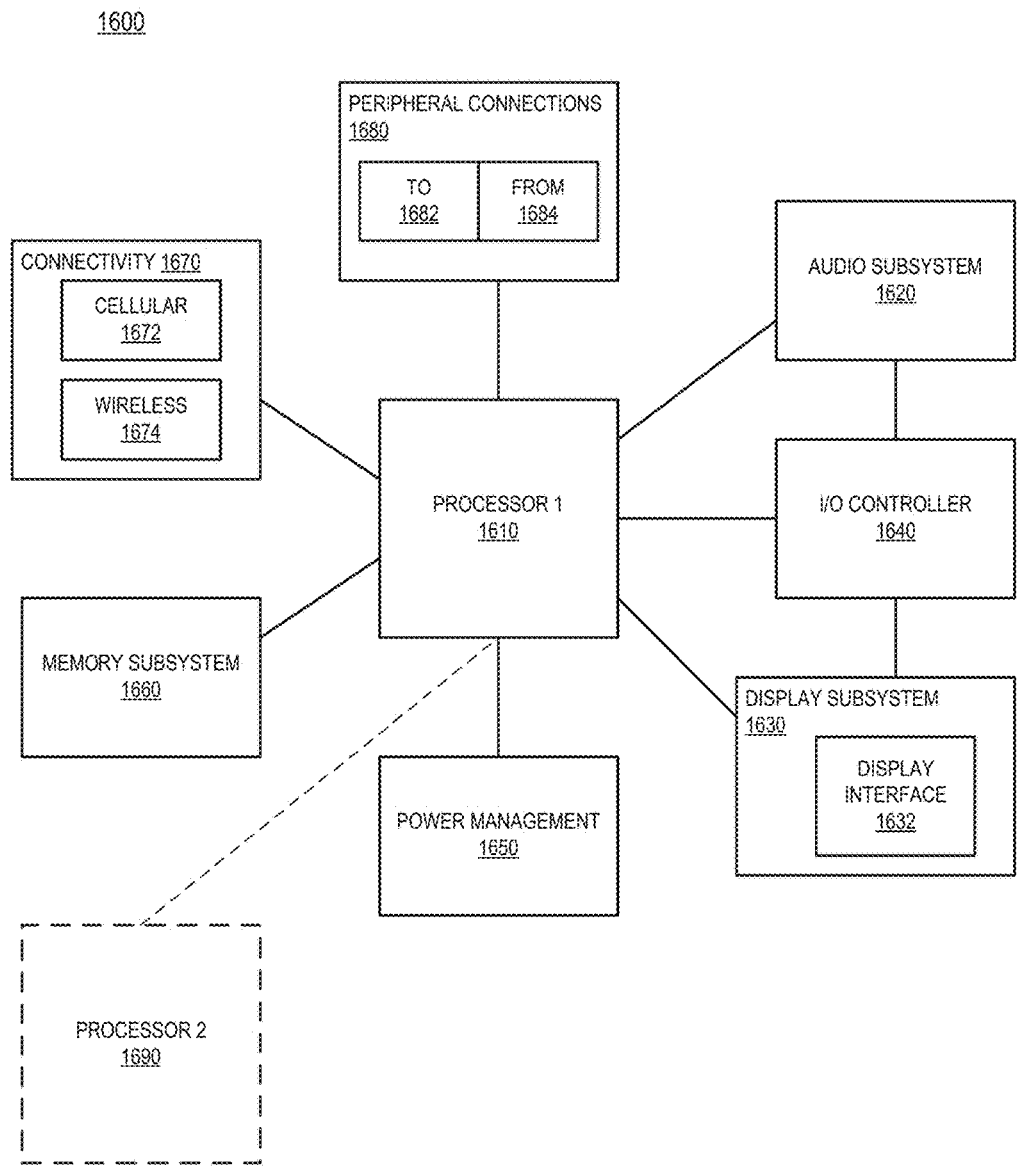
FIG. 6 illustrates a smart device or a computer system or a SoC (System-on-Chip) with apparatus for mapping binary data to ternary data and back, according to some embodiments.

FIG. 6 illustrates a smart device or a computer system or a SoC (System-on-Chip) with apparatus for mapping binary to ternary and back, according to some embodiments. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with apparatus for mapping binary to ternary and back, according to some embodiments discussed. Other blocks of the computing device 1600 may also include apparatus for mapping binary to ternary and back according to some embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first LUT having a mapping of 19 binary bits to 12 ternary trits; and a first logic to receive a binary input and to convert the binary input to a ternary output according to the first LUT. In some embodiments, the apparatus comprises: a second LUT having a mapping of 12 ternary trits to 19 binary bits; and a second logic to receive the ternary output and to convert it to a binary output according to the second LUT. In some embodiments, the first LUT includes 19 entries corresponding to the power of 2 values in ternary for power of 2 from 0 to 18.

In some embodiments, the second LUT includes 12 entries corresponding to the power of 3 values in binary for power of 3 from 0 to 11. In some embodiments, the first logic comprises: logic to initialize the ternary output to zero. In some embodiments, the first logic comprises: logic to determine the location of ones in binary input. In some embodiments, the binary input has 19 binary bits. In some embodiments, the first logic comprises logic to detect a one in the binary input. In some embodiments, the first logic comprises: logic to read from the first LUT a ternary representation according to a corresponding location of one from the location of ones in the binary input.

In some embodiments, the first logic comprises an adder to add, in ternary domain, the ternary representation to the initialized ternary output to generate the ternary output. In some embodiments, the ternary output is a 12 ternary symbol value. In some embodiments, the second logic comprises: logic to read the ternary output and to initialize the binary output to zero. In some embodiments, the second logic comprises: logic to determine location of ones in the 12 ternary trits of the ternary output; logic to read from the second LUT a binary representation according to a corresponding location of one from the location of ones in the ternary input; and an adder to add, in binary domain, the binary representation to the initialized binary output to generate the binary output.

In another example, a system is provided which comprises: a non-volatile memory; a processor coupled to the non-volatile memory, the processor including: a first LUT having a mapping of 19 binary bits to 12 ternary trits; a second LUT having a mapping of 12 ternary trits to 19 binary bits; a first logic to receive a binary input and to convert the binary input to a ternary output according to the first LUT; and an encoder to receive the ternary output and encode the ternary output to generate an encoded ternary output for storing in the non-volatile memory; and a wireless interface for allowing the processor to communicate with another device.

In some embodiments, the system comprises: a decoder to decode the encoded ternary output and to generate decoded ternary output. In some embodiments, the system comprises: a second logic to receive the decoded ternary output and to convert it to a binary output according to the second LUT. In some embodiments, the encoder is a ternary LDPC encoder, and wherein the decoder is a ternary LDPC decoder. In some embodiments, the first LUT includes 19 entries corresponding to the power of 2 values in ternary for power of 2 from 0 to 18, and wherein the second LUT includes 12 entries corresponding to the power of 3 values in binary for power of 3 from 0 to 11.

In another example, a method is provided which comprises: receiving a binary input; and converting the binary input to a ternary output according to a first LUT, the first LUT having a mapping of 19 binary bits to 12 ternary trits. In some embodiments, the method comprises: receiving the ternary output; and converting the ternary output to a binary output according to a second LUT, the second LUT having a mapping of 12 ternary trits to 19 binary bits. In some embodiments, the first LUT includes 19 entries corresponding to the power of 2 values in ternary for power of 2 from 0 to 18. In some embodiments, the second LUT includes 12 entries corresponding to the power of 3 values in binary for power of 3 from 0 to 11. In some embodiments, the method comprises initializing the ternary output to zero. In some embodiments, the method comprises determining the location of ones in binary input. In some embodiments, the binary input has 19 binary bits.

In some embodiments, the method comprises detecting a one in the binary input. In some embodiments, the method comprises reading from the first LUT a ternary representation according to a corresponding location of one from the location of ones in the binary input. In some embodiments, the method comprises adding, in ternary domain, the ternary representation to the initialized ternary output to generate the ternary output. In some embodiments, the ternary output is a 12 ternary symbol value. In some embodiments, the method comprises: reading the ternary output; and initializing the binary output to zero.

In some embodiments, the method comprises determining location of ones in the 12 ternary trits of the ternary output. In some embodiments, the method comprises reading from the second LUT a binary representation according to a corresponding location of one from the location of ones in the ternary input. In some embodiments, the method adding, in binary domain, the binary representation to the initialized binary output to generate the binary output.

In another example, an apparatus is provided which comprises: means for receiving a binary input; and means for converting the binary input to a ternary output according to a first LUT, the first LUT having a mapping of 19 binary bits to 12 ternary trits. In some embodiments, the apparatus comprises: means for receiving the ternary output; and means for converting the ternary output to a binary output according to a second LUT, the second LUT having a mapping of 12 ternary trits to 19 binary bits. In some embodiments, the first LUT includes 19 entries corresponding to the power of 2 values in ternary for power of 2 from 0 to 18. In some embodiments, the second LUT includes 12 entries corresponding to the power of 3 values in binary for power of 3 from 0 to 11.

In some embodiments, the apparatus comprises means for initializing the ternary output to zero. In some embodiments, the apparatus comprises means for determining the location of ones in binary input. In some embodiments, the binary input has 19 binary bits. In some embodiments, the apparatus comprises means for detecting a one in the binary input. In some embodiments, the apparatus comprises means for reading from the first LUT a ternary representation according to a corresponding location of one from the location of ones in the binary input.

In some embodiments, the apparatus comprises means for adding, in ternary domain, the ternary representation to the initialized ternary output to generate the ternary output. In some embodiments, the ternary output is a 12 ternary symbol value. In some embodiments, the apparatus comprises: means for reading the ternary output; and means for initializing the binary output to zero. In some embodiments, the apparatus comprises means for determining location of ones in the 12 ternary trits of the ternary output. In some embodiments, the apparatus comprises means for reading from the second LUT a binary representation according to a corresponding location of one from the location of ones in the ternary input. In some embodiments, the apparatus comprises means for adding, in binary domain, the binary representation to the initialized binary output to generate the binary output.

In another example, a system is provided which comprises: a non-volatile memory; a processor coupled to the non-volatile memory, the processor including an apparatus according to the apparatus described above; and a wireless interface for allowing the processor to communicate with another device. In some embodiments, the non-volatile memory is one of a NAND memory or PCM. In some embodiments, the system comprises a display interface for allowing a display unit to display content processed by the processor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first look-up table (LUT) having a mapping of 19 binary bits to 12 ternary trits, wherein the first LUT is implemented in hardware as logic gates in a range of about 100 gates, and wherein the first LUT includes numbers that represent:

| Binary Value | Ternary Representation |
|---|---|
| $2^0 = 1$ | 1 |
| $2^1 = 2$ | 2 |
| $2^2 = 4$ | 11 |
| $2^3 = 8$ | 22 |
| $2^4 = 16$ | 121 |
| $2^5 = 32$ | 1012 |
| ... | |
| $2^{18} = 262,144$ | 111022121001 | and
a first logic communicatively coupled to the first LUT, wherein the first logic is to receive a binary input and is to convert the binary input to a ternary output according to the first LUT, and wherein the conversion to the ternary output is unique and lossless.

2. The apparatus of claim 1 comprises:
a second LUT having a mapping of 12 ternary trits to 19 binary bits; and a second logic to receive the ternary output and to convert it to a binary output according to the second LUT, wherein the conversion to the binary output is unique and lossless.

3. The apparatus of claim 1, wherein the first LUT includes 19 entries corresponding to the power of 2 values in ternary for power of 2 from 0 to 18.

4. The apparatus of claim 2, wherein the second LUT includes 12 entries corresponding to the power of 3 values in binary for power of 3 from 0 to 11.

5. The apparatus of claim 1, wherein the first logic comprises: logic to initialize the ternary output to zero.

6. The apparatus of claim 5, wherein the first logic comprises: logic to determine the location of ones in binary input.

7. The apparatus of claim 6, wherein the binary input has 19 binary bits.

8. The apparatus of claim 6, wherein the first logic comprises logic to detect a one in the binary input.

9. The apparatus of claim 6, wherein the first logic comprises: logic to read from the first LUT a ternary representation according to a corresponding location of one from the location of ones in the binary input.

10. The apparatus of claim 9, wherein the first logic comprises an adder to add, in ternary domain, the ternary representation to the initialized ternary output to generate the ternary output.

11. The apparatus of claim 10, wherein the ternary output is a 12 ternary symbol value.

12. The apparatus of claim 2, wherein the second logic comprises: logic to read the ternary output and to initialize the binary output to zero.

13. The apparatus of claim 12, wherein the second logic comprises:
logic to determine location of ones in the 12 ternary trits of the ternary output;
logic to read from the second LUT a binary representation according to a corresponding location of one from the location of ones in the ternary input; and
an adder to add, in binary domain, the binary representation to the initialized binary output to generate the binary output.

14. A system comprising:
a non-volatile memory;
a processor coupled to the non-volatile memory, the processor including:
a first look-up table (LUT) having a mapping of 19 binary bits to 12 ternary trits; wherein the first LUT includes numbers that represent:

| Binary Value | Ternary Representation |
|---|---|
| $2^0 = 1$ | 1 |
| $2^1 = 2$ | 2 |
| $2^2 = 4$ | 11 |
| $2^3 = 8$ | 22 |
| $2^4 = 16$ | 121 |
| $2^5 = 32$ | 1012 |
| ... | |
| $2^{18} = 262,144$ | 111022121001 | a second LUT having a mapping of 12 ternary trits to 19 binary bits;
wherein the second LUT includes numbers that represent:

| Ternary Value | Binary Representation |
|---|---|
| $3^0 = 1$ | 1 |
| $3^1 = 3$ | 11 |
| $3^2 = 9$ | 1001 |
| $3^3 = 27$ | 11011 |
| $3^4 = 81$ | 1010001 |
| $3^5 = 243$ | 11110011 |
| ... | |
| $3^{11} = 177,174$ | 101011010000010110 | a first logic to receive a binary input and to convert the binary input to a ternary output according to the first LUT, wherein the conversion to the ternary output is unique and lossless; and
an encoder to receive the ternary output and encode the ternary output to generate an encoded ternary output for storing in the non-volatile memory; and
a wireless interface to allow the processor to communicate with another device.

15. The system of claim 14 comprises:
a decoder to decode the encoded ternary output and to generate decoded ternary output.

16. The system of claim 15 comprises:
a second logic to receive the decoded ternary output and to convert it to a binary output according to the second LUT, wherein the conversion to the binary output is unique and lossless.

17. The system of claim 14, wherein the encoder is a ternary LDPC encoder, and wherein the decoder is a ternary LDPC decoder.

18. The system of claim 14, wherein the first LUT includes 19 entries corresponding to the power of 2 values in ternary for power of 2 from 0 to 18, and wherein the second LUT includes 12 entries corresponding to the power of 3 values in binary for power of 3 from 0 to 11.

19. An apparatus comprising:
a first look-up table (LUT) having a mapping of 19 binary bits to 12 ternary trits, wherein the first LUT is implemented in hardware as logic gates in a range of about 100 gates, wherein the first LUT includes numbers that represent:

| Binary Value | Ternary Representation |
|---|---|
| $2^0 = 1$ | 1 |
| $2^1 = 2$ | 2 |
| $2^2 = 4$ | 11 |
| $2^3 = 8$ | 22 |
| $2^4 = 16$ | 121 |
| $2^5 = 32$ | 1012 |
| ... | |
| $2^{18} = 262,144$ | 111022121001; | and
a first circuitry communicatively coupled to the first LUT, wherein the first circuitry is to receive a binary input and to convert the binary input to a ternary output according to the first LUT, and wherein the conversion to the ternary output is unique and lossless.

20. The apparatus of claim 19 comprises:
a second LUT having a mapping of 12 ternary trits to 19 binary bits; and
a second circuitry to receive the ternary output and to convert it to a binary output according to the second LUT, wherein the conversion to the binary output is unique and lossless, and wherein the second LUT includes numbers that represent:

| Ternary Value | Binary Representation |
|---|---|
| $3^0 = 1$ | 1 |
| $3^1 = 3$ | 11 |
| $3^2 = 9$ | 1001 |
| $3^3 = 27$ | 11011 |
| $3^4 = 81$ | 1010001 |
| $3^5 = 243$ | 11110011 |
| . . . | |
| $3^{11} = 177,174$ | 101011010000010110. |

21. The apparatus of claim 20, wherein:
the first LUT includes 19 entries corresponding to the power of 2 values in ternary for power of 2 from 0 to 18; and
the second LUT includes 12 entries corresponding to the power of 3 values in binary for power of 3 from 0 to 11.

22. The apparatus of claim 20, wherein the first circuitry comprises:
third circuitry to initialize the ternary output to zero;
fourth circuitry to determine the location of ones in binary input, wherein the binary input has 19 binary bits;
fifth circuitry to detect a one in the binary input;
sixth circuitry to read from the first LUT a ternary representation according to a corresponding location of one from the location of ones in the binary input; and
an adder to add, in ternary domain, the ternary representation to the initialized ternary output to generate the ternary output, wherein the ternary output is a 12 ternary symbol value.

23. The apparatus of claim 20, wherein the second circuitry comprises:
seventh circuitry to read the ternary output and to initialize the binary output to zero;
eighth to determine location of ones in the 12 ternary trits of the ternary output;
ninth to read from the second LUT a binary representation according to a corresponding location of one from the location of ones in the ternary input; and
an adder to add, in binary domain, the binary representation to the initialized binary output to generate the binary output.

* * * * *